(12) United States Patent
Tsai et al.

(10) Patent No.: US 7,122,904 B2
(45) Date of Patent: Oct. 17, 2006

(54) SEMICONDUCTOR PACKAGING DEVICE AND MANUFACTURE THEREOF

(75) Inventors: Chen-Jung Tsai, Hsin-Chu (TW);
Jui-Chung Lee, Yun-Lin (TW);
Chih-Wen Lin, Hsin-Chu (TW)

(73) Assignee: Macronix International Co., Ltd., (TW)

( * ) Notice: Subject to any disclaimer, the term of this patent is extended or adjusted under 35 U.S.C. 154(b) by 0 days.

(21) Appl. No.: 10/131,485

(22) Filed: Apr. 25, 2002

(65) Prior Publication Data
US 2003/0201521 A1   Oct. 30, 2003

(51) Int. Cl.
*H01L 23/48* (2006.01)
*H01L 23/52* (2006.01)
*H01L 29/40* (2006.01)

(52) U.S. Cl. .................. 257/778; 257/774; 257/780; 257/686

(58) Field of Classification Search ............. 257/686, 257/778, 780, 738, 774
See application file for complete search history.

(56) References Cited

U.S. PATENT DOCUMENTS

| | | | | |
|---|---|---|---|---|
| 5,353,498 A | * | 10/1994 | Fillion et al. | 29/840 |
| 5,524,339 A | * | 6/1996 | Gorowitz et al. | 29/841 |
| 6,075,712 A | * | 6/2000 | McMahon | 361/783 |
| 6,140,707 A | * | 10/2000 | Plepys et al. | 257/778 |
| 6,271,469 B1 | * | 8/2001 | Ma et al. | 174/52.4 |
| 2002/0074652 A1 | * | 6/2002 | Pierce | 257/724 |

* cited by examiner

*Primary Examiner*—Nitin Parekh

(57) ABSTRACT

A semiconductor packaging device comprises a carrier having at least a cavity or a slot thereon. At least a chip has a back surface and an active surface with a plurality of first bonding pads. The chip is affixed to the cavity to expose the active surface. A first insulating layer is on the active surface and the carrier, which comprises first via-conductor connected to first bonding pads and via the first insulating layer. A multi-layer structure on the first insulating layer comprises a plurality of conductive layout lines, second via-conductor therein, and a second insulating layer, exposed ball pads, and flip-chip pads thereon. The first via-conductor are electrically connected with the conductive layout lines, the second via-conductor, the exposed ball pads, and the flip-chip pads. The first solder balls are affixed to the ball pads, and at least a second chip is affixed to the flip-chip pads through a plurality of second solder balls.

4 Claims, 9 Drawing Sheets

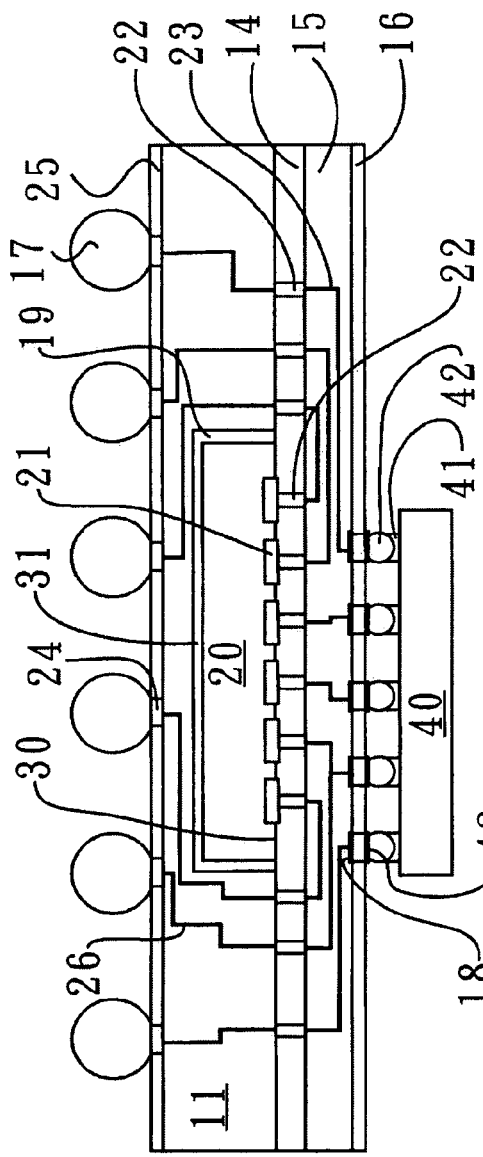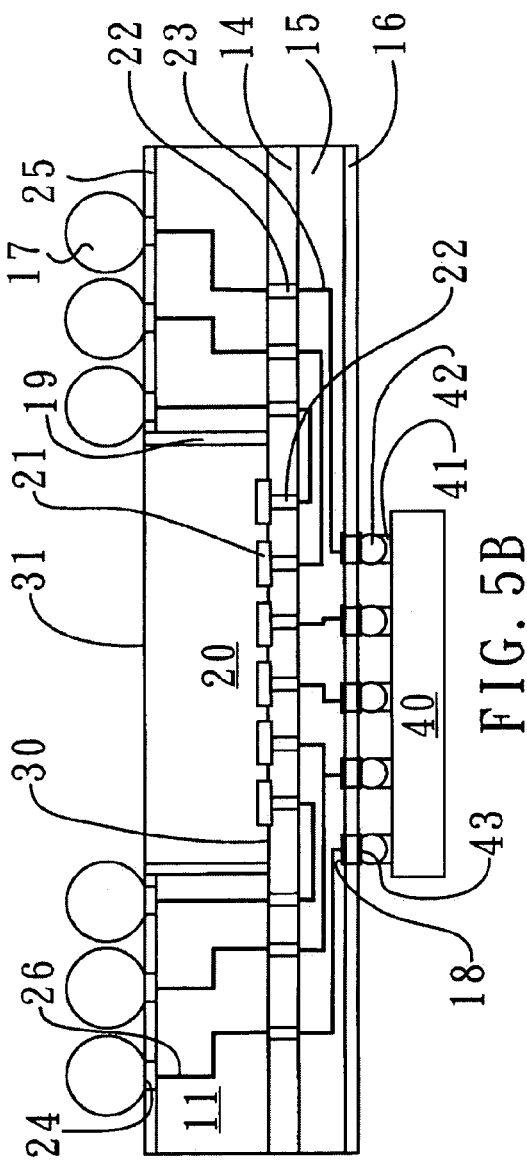

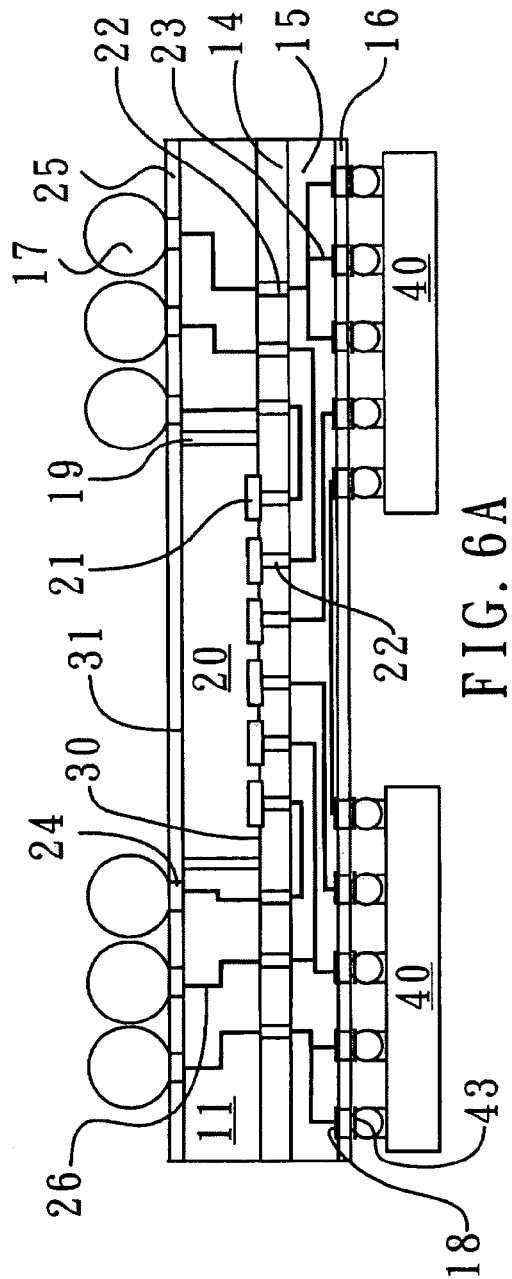
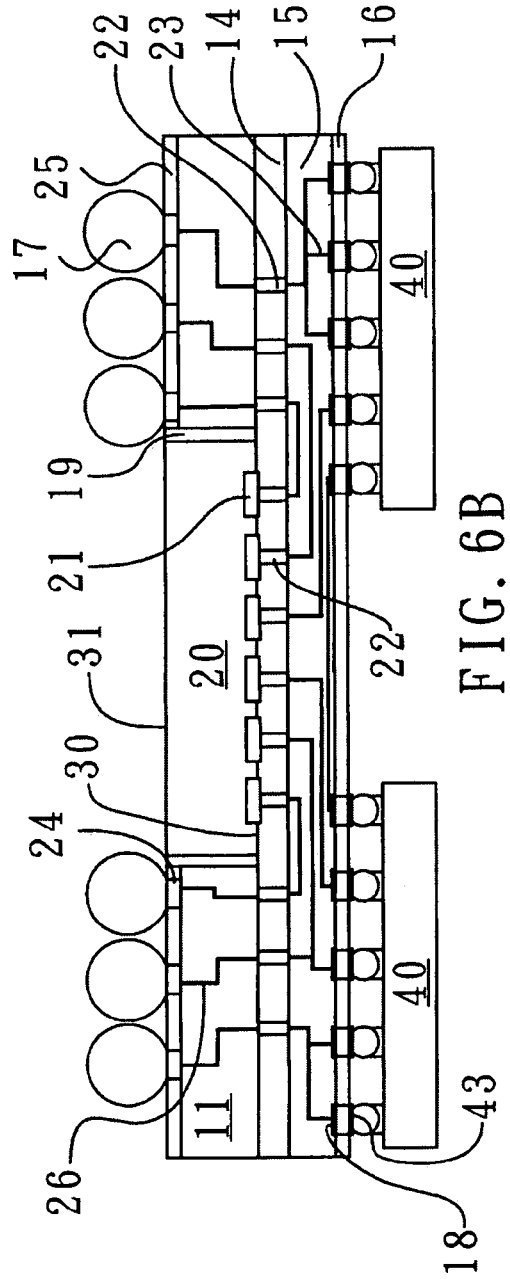
FIG. 6A
FIG. 6B

SEMICONDUCTOR PACKAGING DEVICE AND MANUFACTURE THEREOF

BACKGROUND OF THE INVENTION

1. Field of the Invention

The invention relates to a stacking semiconductor-packaging device and manufacture thereof, and more particularly relates to a structure of flip chip ball grid array (FCBGA) and manufacture thereof.

2. Description of the Prior Art

In packaging manufacture, especially in packaging manufacture of FCBGA for integrated circuits (ICs) of high-density I/O or few I/O on small area, the bonding pads on ICs need to be rearranged for an array by a redistribution process, followed by the formation of under-bumping-metallization layer and solder bumps. Due to the limitation of general print circuit board (PCB) on the high-density I/O layout of integrated circuits, a flip chip is first affixed to a build-up substrate, followed by fanning-out the I/O pins of the flip chip to become great-pitch-distribution area.

However, due to the small solder bumps on the flip chips and the difference of thermal expansion between the solder bumps and the BT substrate, it is necessary to fill the gaps among the flip chip, solder bumps, and a general substrate with under filled gel on consideration of reliability. Thus, the consumptions of time and cost for such a process are high.

SUMMARY OF THE INVENTION

It is one object of the present invention to provide a semiconductor packaging and manufacture thereof. An additionally high-cost fan-out process and thereto relative steps are not necessary for the present invention.

Improved structure of FCBGA and manufacture thereof. The redistribution and solder-bump process for a conventional structure of FCBGA are simplified and integrated into the fan-out process of build-up substrate.

It is further object of the present invention to provide a novel packaging structure with improved reliability and manufacture thereof. A chip is prevented from affixing to a PCB directly such that a thickness of the novel packing structure is minimum and met with the requirement of heat radiation.

In the present invention, a semiconductor packaging device comprises a carrier having at least an affixing hole, i.e. a cavity or a slot thereon. At least a chip has a back surface and an active surface with a plurality of first bonding pads. The chip is affixed to the cavity to expose the active surface. A first insulating layer is on the active surface and the carrier, which comprises first via-conductor connected to first bonding pads and via the first insulating layer. A multi-layer structure on the first insulating layer comprises a plurality of conductive layout lines, second via-conductor therein, and a second insulating layer, ball pads, and flip-chip pads thereon. The first via-conductors are electrically connected with the conductive layout lines, the second via-conductor, the ball pads, and the flip-chip pads. The first solder balls are affixed to the ball pads, and at least a second chip is affixed to the flip-chip pads through a plurality of second solder balls. Such architecture integrates the redistribution and fan-out process, which simplifies the conventional process for flip-chip ball grid array.

BRIEF DESCRIPTION OF THE DRAWINGS

A better understanding of the invention may be derived by reading the following detailed description with reference to the accompanying drawings wherein:

FIG. 5A is a cross-sectional schematic diagram illustrating the packaging chip cut with line 2A—2A in FIG. 2;

FIG. 5B is a cross-sectional schematic diagram illustrating the packaging chip cut with line 2A—2A in FIG. 2;

FIG. 6A is a cross-sectional schematic diagram illustrating the packaging chip cut with line 2A—2A in FIG. 2;

FIG. 6B is a cross-sectional schematic diagram illustrating the packaging chip cut with line 2A—2A in FIG. 2;

DESCRIPTION OF THE PREFERRED EMBODIMENT

While the invention is described in terms of a single preferred embodiment, those skilled in the art will recognize that many devices described below can be altered as well as other substitutions with same function and can be freely made without departing from the spirit and scope of the invention.

Furthermore, there is shown a representative portion of semiconductor packaging of the present invention in enlarged. The drawings are not necessarily to scale for clarify of illustration and should not be interpreted in a limiting sense. Furthermore, the present invention can be applied on various multichip devices or packages.

In the present invention, a semiconductor packaging device comprises a carrier having at least an affixing hole, i.e. a cavity or a slot thereon. At least a chip has a back surface and an active surface with a plurality of first bonding pads. The chip is affixed to the cavity to expose the active surface. A first insulating layer is on the active surface and the carrier, which comprises first via-conductor connected to first bonding pads and via the first insulating layer. A multi-layer structure on the first insulating layer comprises a plurality of conductive layout lines, second via-conductor therein, and a second insulating layer, ball pads, and flip-chip pads thereon. The first via-conductors are electrically connected with the conductive layout lines, the second via-conductor, the ball pads, and the flip-chip pads. The first solder balls are affixed to the ball pads, and at least a second chip is affixed to the flip-chip pads through a plurality of second solder balls. Such architecture integrates the redistribution and fan-out process, which simplifies the conventional process for flip-chip ball grid array.

Figure 1:
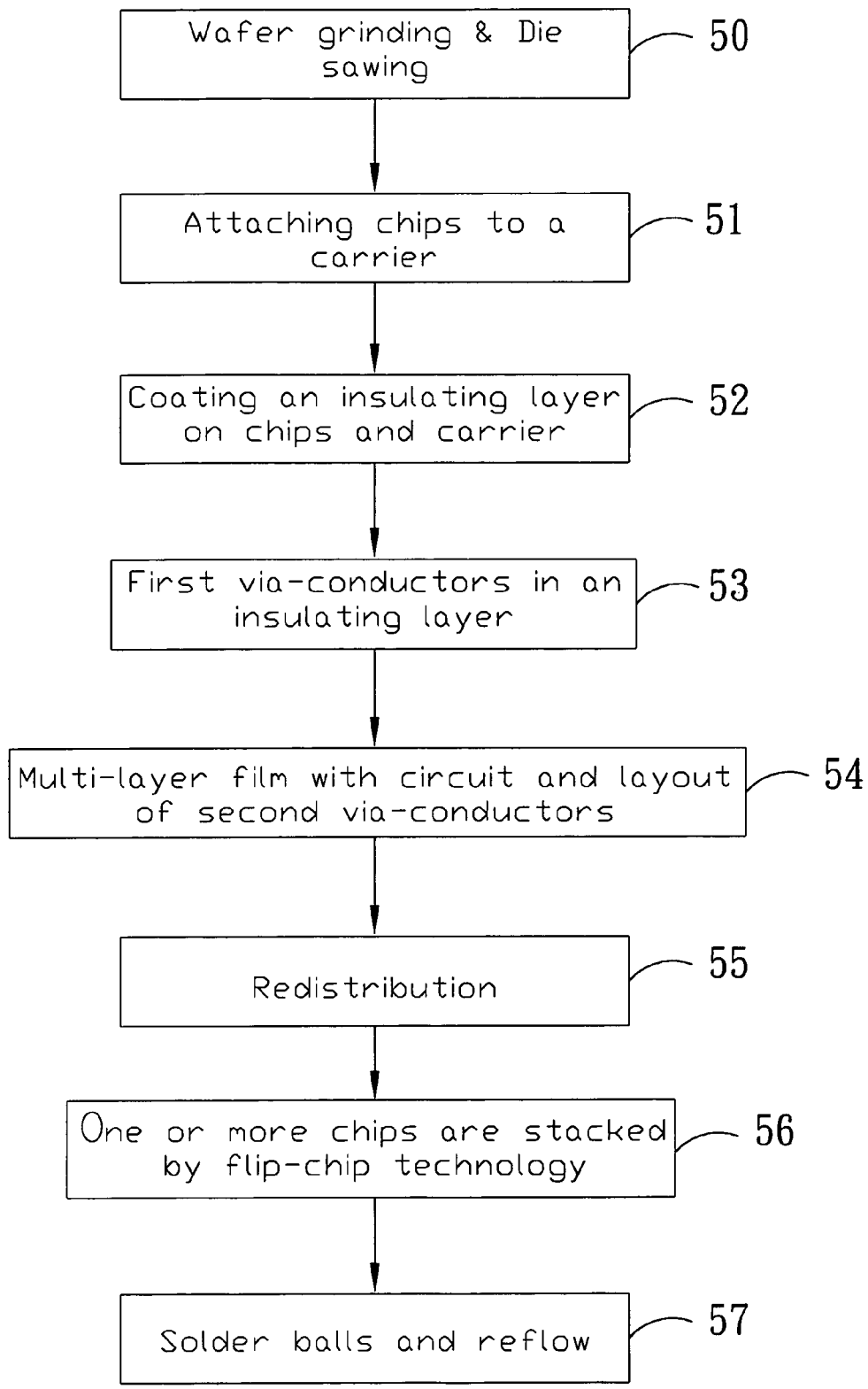
FIG. 1 is a flow chart illustrating the manufacture process in accordance with the present invention.

FIG. 1 is a flow chart illustrating the manufacture process in accordance with the present invention. One embodiment of the present invention is a manufacture process of FCBGA. A wafer is first grinded and the dies (chips) on the grinded wafer are sawed (step 50). The chips are attached to a carrier having multitudes of cavities or slots (step 51), wherein the active surfaces of the chips are faced upwards and the back surfaces/sidewalls of the chips are affixed to the cavities with adhesive. Furthermore, the carrier can be made of silicon, ceramic, glass, or organic substrate, and so on. Next, an insulating layer is coated on the active surfaces of the chips and the surface of the carrier, and thereafter multitudes of bonding pads on the surroundings of the active surfaces are exposed (step 52). The coating of the insulating layer can be implemented by conventional process of semiconductor film. And the insulating layer provides protection and planarization for the chips and the carrier. Furthermore, multitudes of first conductive via holes (via-conductor) are made in the insulating layer (step 53), wherein the first conductive holes are located corresponding to the bonding pads on the chip.

A layout for second conductive via holes and a multi-layer circuit are implemented on the insulating layer (step 54). The multi-layer circuit connects electrically the first via holes with the second via holes. Next, the re-distribution is implemented (step 55), wherein those re-distributed bonding pads are located corresponding to the second conductive via holes and aligned to a great-pitch array on a substrate. It can be implemented by conventional redistribution process and the process of under bump metallization. That is, a single/multi-layer film with predetermined circuit and via-conductor is used to adhered to the adhesive on the chips and the carrier, wherein the via-conductor are connected to the bonding pads of the chip. Then another adhesive is coated on the single/multi-layer film and the pads of the via-conductor are exposed. Furthermore, one or more chips similar or different in sizes are stacked on the above-mentioned structure by the flip-chip technology (step 56). Next, the packaging chips are grinded and sawed followed by attaching multitudes of solder balls to the predetermined location (the locations of re-distributed pads and the second via holes) and reflow (step 57). The attachment of the solder balls can be implemented by conventional methods for ball grid array. Furthermore, the chips and the carriers can be grinded to a predetermined packaging thickness.

Figure 2:
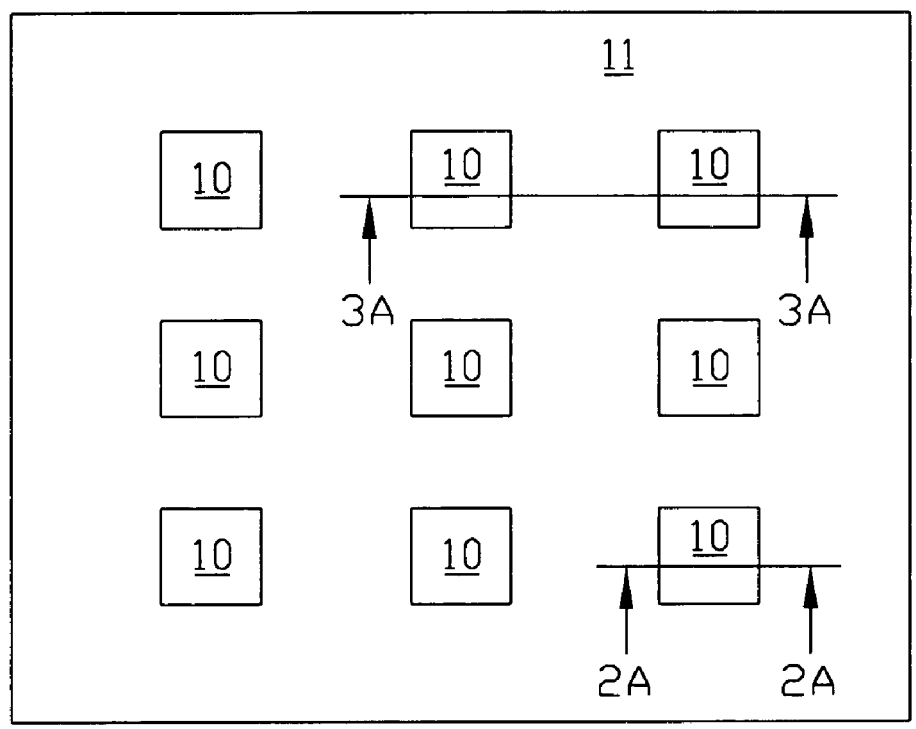
FIG. 2 is a plane view illustrating the arrangement of the chips and the carrier in accordance with the present invention.

FIG. 2 is a plane view illustrating the arrangement of the chips and the carrier in accordance with the present invention. Depicted in FIG. 2, there are multitudes of cavities 10 (or slots) on the carrier 11, in which each one is fitted for one chip. The back surfaces of the chips are affixed to the bottoms of the cavities with adhesive, as well as the sidewalls of the chips to the sidewalls of the cavities.

FIG. 3, FIG. 4, FIG. 5A and FIG. 5B are cross-sectional views illustrating the packaging chip cut with line 2A—2A of FIG. 2. Depicted in FIG. 3, solder balls are distributed on the surrounding of the chip. After the chip 20 is placed in the carrier 11 and affixed by an adhesive 19, an insulating layer 14 is formed on the active surface 30 of the chip 20 and the carrier 11 where the bonding pads 21 of the chip 20 are exposed. Multitudes of plating through holes 22 in the insulating layer 14 are connected with the bonding pads 21. A multi-layer film 15 with predetermined circuit 23 (connected to the plating through holes 22) is on the insulating layer 14 and thereafter another insulating layer 16 is formed on the multi-layer film 15 only to expose the pads 18 of the plating through holes 22 and multitudes of flip-chip pads 43. To be specific, both the pads 18 and the flip-chip pads 43 are distributed above the carrier 11, the chip 20, or both.

Next, one or more chips are stacked by the flip-chip technology and affixed through the bonding pads 41 of the chips 40, solder balls 42, and the flip-chip pads 43. Then the solder balls 17 are affixed to the pads 43. To be specific, the chips 40 would have the sizes similar to or different from the chip 20 has. Furthermore, it is necessary for the solder balls 17 to have a vertical height thicker than the height summation of the chips 40, bonding pads 41, and the solder balls 43, and so on.

Figure 3:
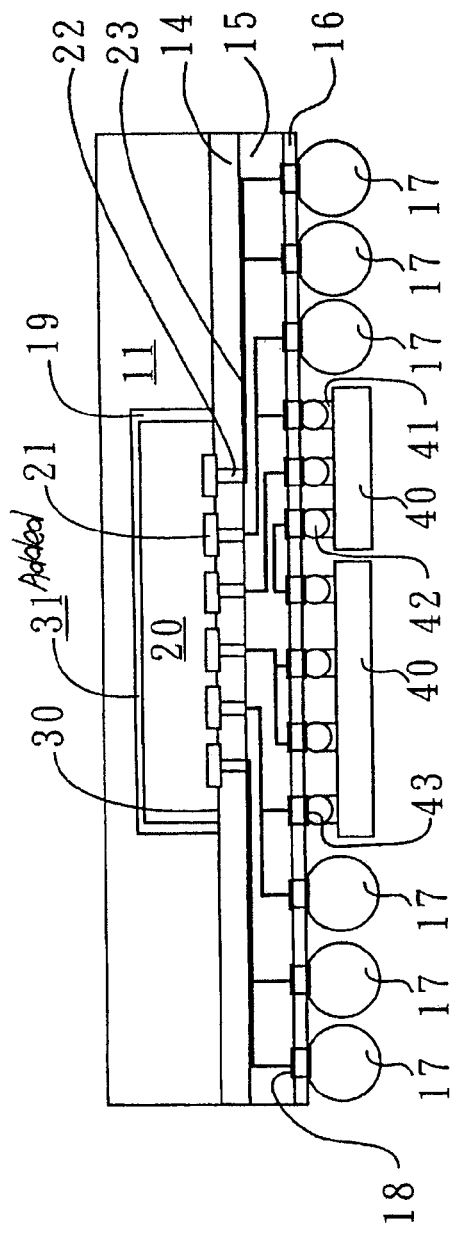
FIG. 3 is a cross-sectional schematic diagram illustrating the packaging chip cut with line 2A—2A in FIG. 2.
Figure 4:
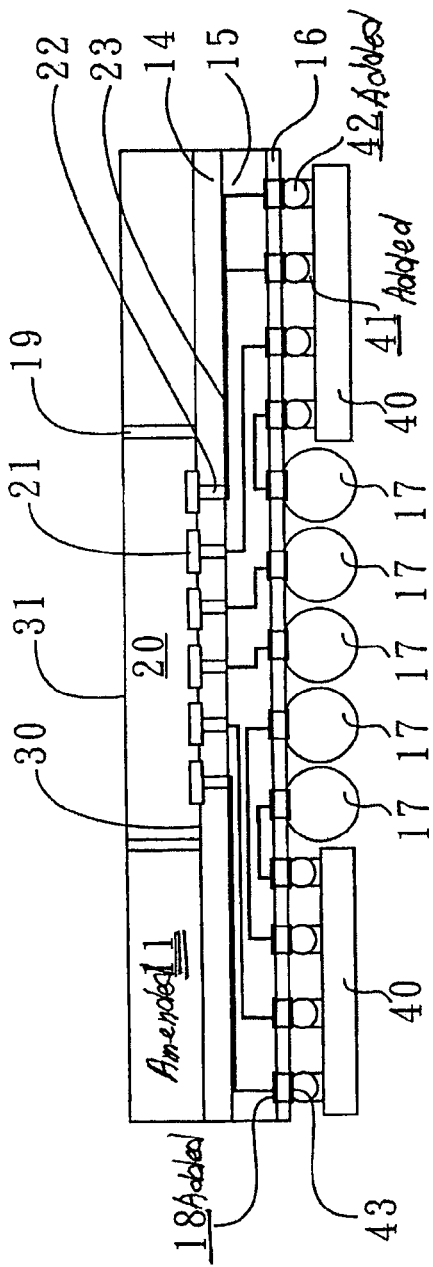
FIG. 4 is a cross-sectional schematic diagrams illustrating the packaging chip cut with line 2A—2A in FIG. 2.

Shown in FIG. 4 similar to FIG. 3, the thickness of a carrier 11 is almost equal to one of the chip 20 such that the back surface 31 of the chip 20 is exposed and only the sidewall of the chip 20 is affixed to the carrier 11. The chips 40 are affixed below the carrier 11.

Depicted FIG. 5A, in addition to the back surface 31 of the chip 20 in the cavity of the carrier 11, the carrier 11 could comprise predetermined circuits 26, and solder pads 24 (exposed by an insulating layer 25), when the carrier 11 is made of organic material. The active surface 30 of the chip 20 is connected electrically to the conductive via predetermined circuit 26 of the carrier 11 through the circuit layout 23 of the multi-layer film 15 and the plating through holes 22 in the insulating layer 14. Multitudes of solder balls 17 are affixed to the solder pads 24 of the carrier 11. Next, there are multitudes of flip-chip bonding pads 43 are connected to the plating through holes in the insulating layer 16, whereby they are further connected to the solder balls 42 on the chips 40 through the bonding pads 41.

FIG. 5B is also a cross-sectional view illustrating the packaging chip cut with line 2A—2A in FIG. 2. The chip 20 is exposed the back surface 31 out.

FIG. 6A is a cross-sectional view illustrating the packaging chip cut with line 2A—2A in FIG. 2. Beside of the equal thickness of the chip 20 and the carrier 13, the carrier 13 is made of an organic material so as to have the predetermined circuit 26 therein and solder pads 24 thereon. The active surface 30 of the chip 20 are connected to the solder pads 24 of the carrier 13 through the multi-layer film 15. The solder balls 17 are affixed to the solder pads 24 on the carrier 13 surrounding the back surface 31 of the chip. Two chips 40 have the solder balls 42 affixed to the bonding pads 41, then the solder balls 42 are affixed to the flip-chip bonding pads 43 on the insulating layer 16.

FIG. 6B is also a cross-sectional view illustrating the packaging chip cut with line 2A—2A in FIG. 2. The chip 20 is exposed the back surface 31 out.

Figure 7A:
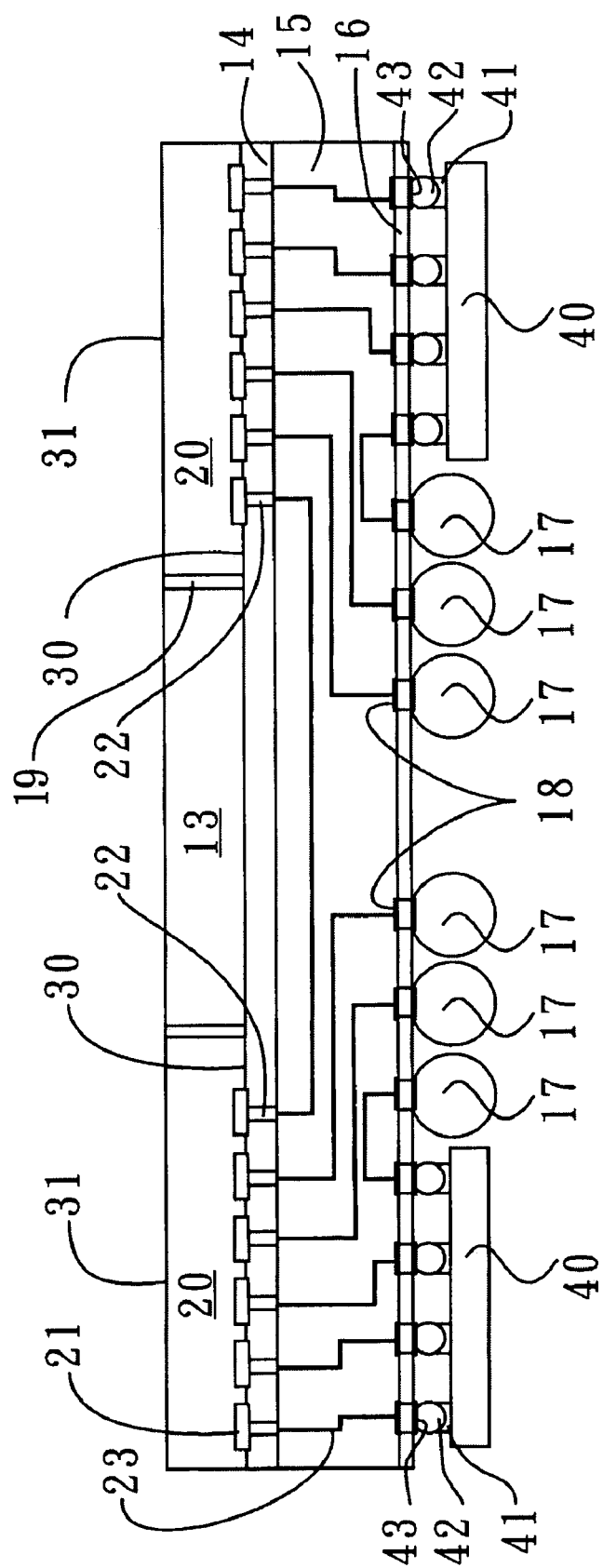
FIG. 7A is a cross-sectional schematic diagram illustrating the packaging chip cut with line 3A—3A in FIG. 2.

FIG. 7A is a cross-sectional view illustrating the packaging chip cut with line 3A—3A in FIG. 2. In this embodiment, the thickness of the carrier 11 is equal to that of the chip 20. Two chips 20 are affixed to the sidewall of the carrier 13 with their individual sidewall, and exposed their individual back surface 31 out. One of advantages in the embodiment, the two chips 20 can have electric interconnection (not shown in figure) through the multi-layer film 15 with its predetermined circuit 23 with which the chips 40 are also connected. To be specific, the carrier 13 in the embodiment is also made of the organic material that can have predetermined layout. The solder balls 17 are distributed on the carrier 13 that is at the same side with the back surface 31 of the chip 20.

Figure 7B:
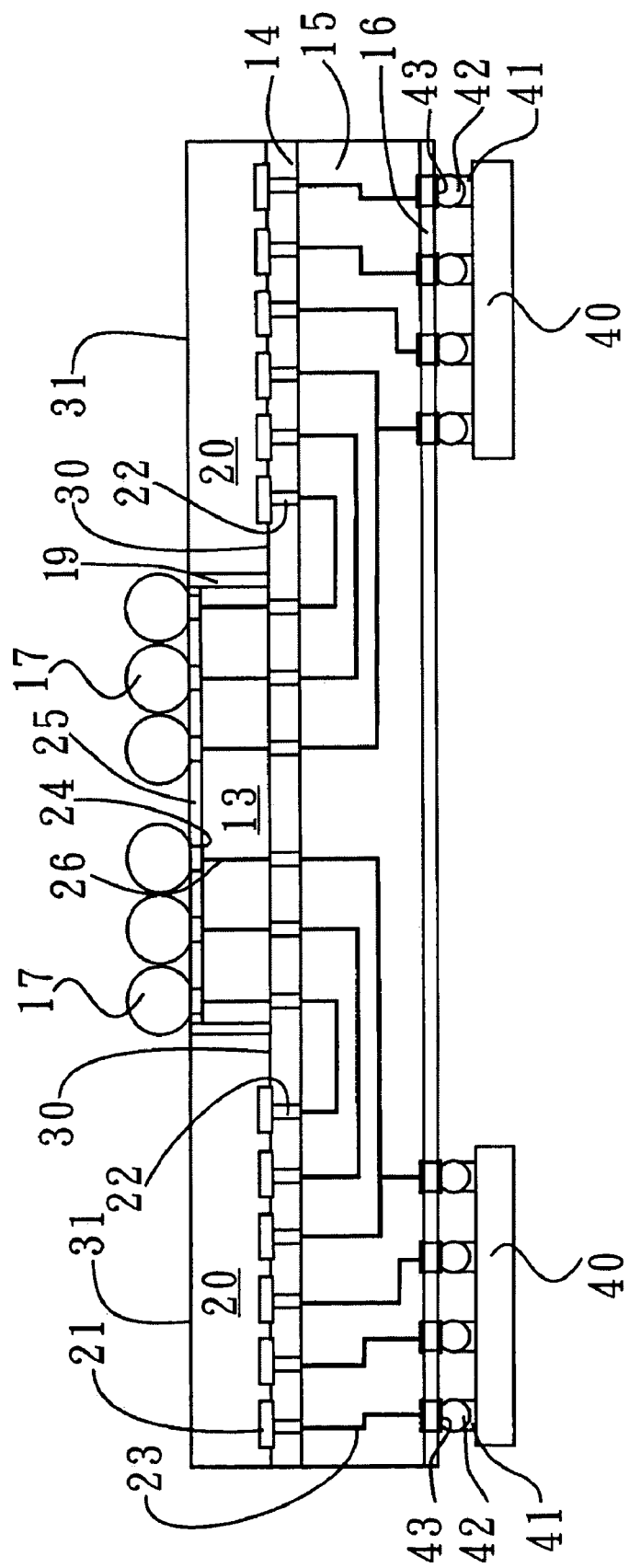
FIG. 7B is a cross-sectional schematic diagram illustrating the packaging chip cut with line 3A—3A in FIG. 2.

FIG. 7B is also a cross-sectional view illustrating the packaging chip cut with line 3A—3A in FIG. 2. The carrier 13 comprises predetermined circuits 26 and solder pads 24 within an insulating layer 25.

Figure 7C:
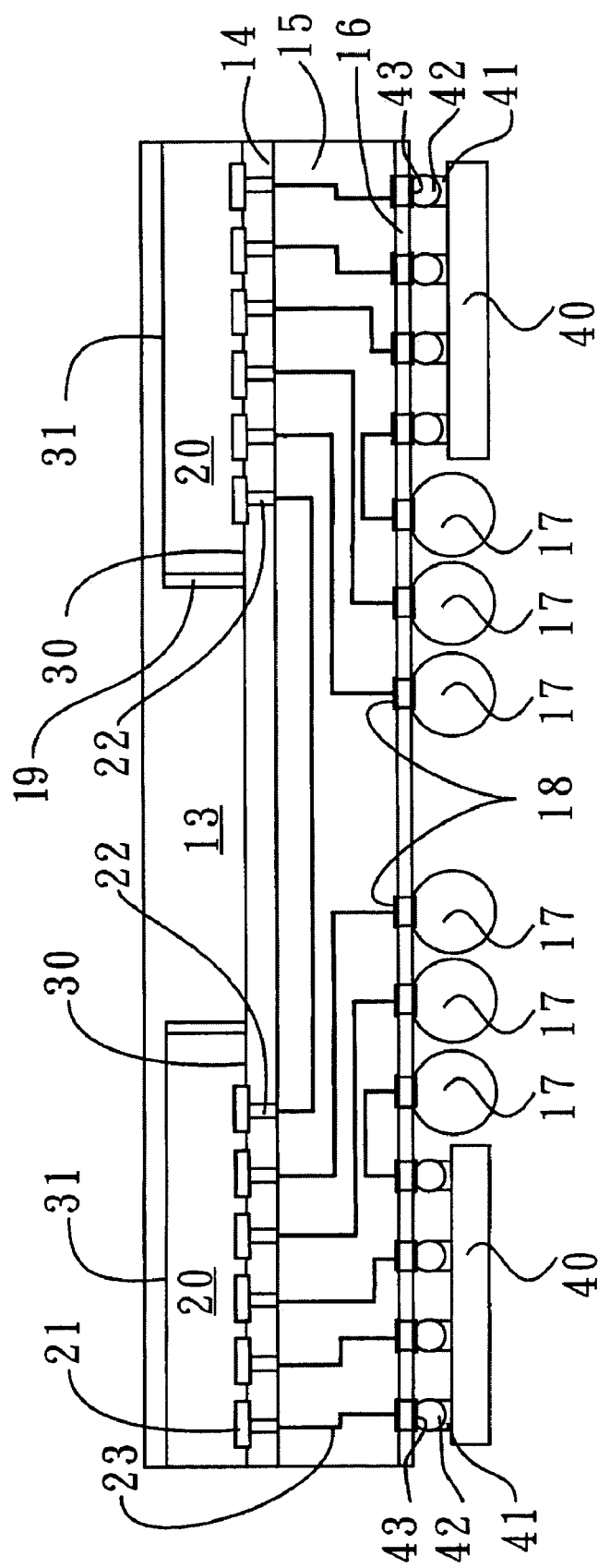
FIG. 7C is a cross-sectional schematic diagram illustrating the packaging chip cut with line 3A—3A in FIG. 2.

FIG. 7C is a cross-sectional view illustrating the packaging chip cut with line 3A—3A in FIG. 2. The chips 20 are not exposed the back surfaces 31 out.

Figure 7D:
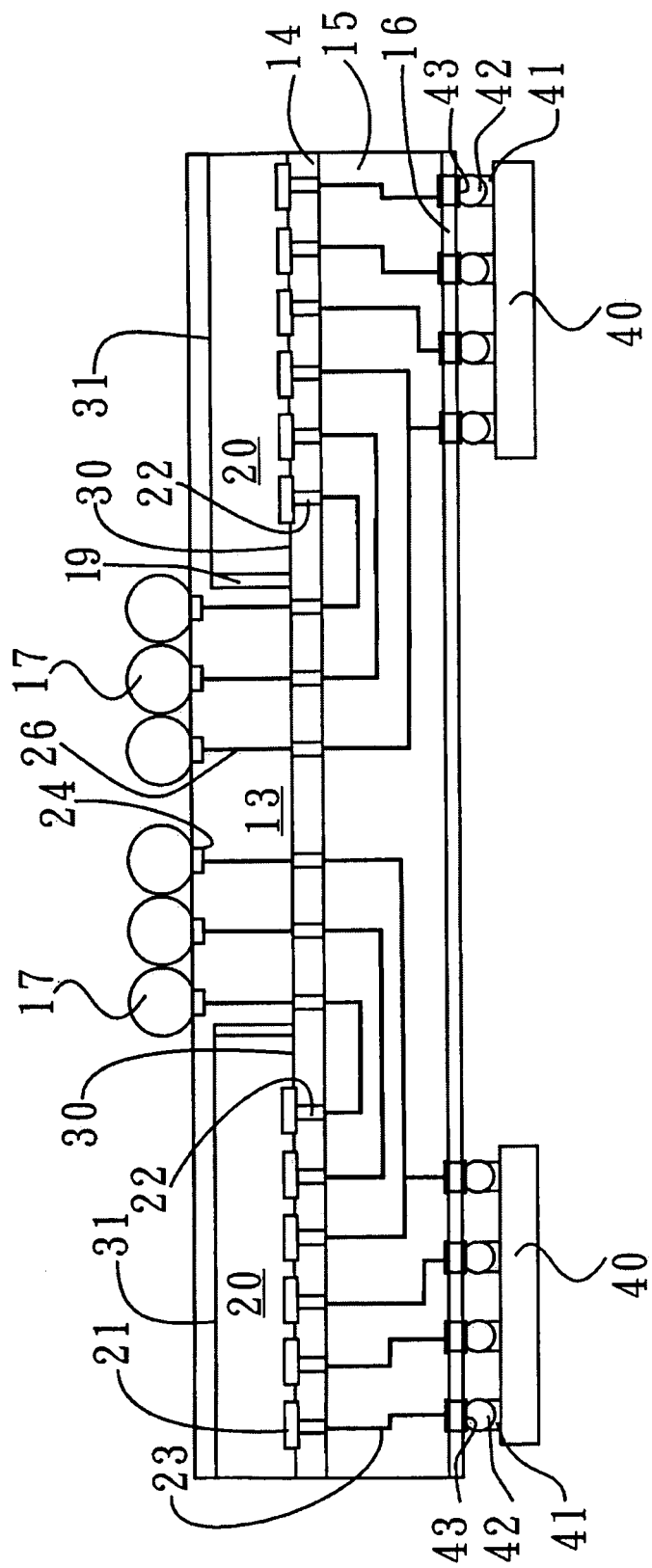
FIG. 7D is a cross-sectional schematic diagram illustrating the packaging chip cut with line 3A—3A in FIG. 2.

FIG. 7D is a cross-sectional view illustrating the packaging chip cut with line 3A—3A in FIG. 2. The chips 20 are not exposed the back surfaces 31 out. The carrier 13 comprises predetermined circuits 26 and solder pads 24.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor packaging device comprising:

a carrier having a predetermined circuit layout therein, a first surface with a plurality of first ball pads, and a second surface with a cavity thereon, and a first insulating layer having a plurality of first bonding pads therein on said first surface of said carrier, and each plurality of first solder balls on each said plurality of said first bonding pads respectively;

at least a first chip having a back surface and an active surface with a plurality of second bonding pads thereon, wherein said first chip is affixed to said cavity of said carrier to expose said active surface;

a second insulating layer on said second surface of said carrier and on said active surface, said second insulating layer having a plurality of first via-conductor therein, said plurality of second bonding pads connected to said plurality of first via-conductor, and portion of said plurality of first via-conductor electrically connected to said plurality of said first bonding pads through said predetermined circuit layout within said carrier;

a multi-layer structure on said second insulating layer, said multi-layer structure comprising:

a plurality of circuit layouts therein;

a plurality of flip-chip pads and a third insulating layer thereon, wherein said plurality of said flip-chip pads are exposed on said third insulating layer, and said third insulating layer has a plurality of second via-conductors that connected to said plurality of said flip-chip pads, and said plurality of said flip-chip pads electrically connected to said plurality of first via-conductors through said plurality of circuit layouts;

a plurality of solder balls affixed to said plurality of said flip-chip pads; and at least a second chip affixed to said plurality of said plurality of said flip-chip pads through a plurality of second solder balls.

2. The semiconductor packaging device according to claim 1, wherein said back surface of said first chip to be exposed to said first insulating layer.

3. The semiconductor packaging device according to claim 1, wherein said plurality of said first solder balls are distributed over said first insulating layer on said first surface of said carrier.

4. The semiconductor packaging device according to claim 1, wherein said plurality of said first solder balls are distributed on sides of said first insulating layer on said first surface of said carrier to expose portion said insulating layer on above said back surface of said first chip.

* * * * *